United States Patent
Reid et al.

(10) Patent No.: US 10,158,033 B2
(45) Date of Patent: Dec. 18, 2018

(54) CONNECTION OF PHOTOACTIVE REGIONS IN AN OPTOELECTRONIC DEVICE

(71) Applicant: OXFORD PHOTOVOLTAICS LIMITED, Yarnton, Oxfordshire (GB)

(72) Inventors: Terence Alan Reid, Yarnton (GB); David Bushnell, Yarnton (GB); Jim Watts, Yarnton (GB)

(73) Assignee: OXFORD PHOTOVOLTAICS LIMITED, Yarnton (GB)

(*) Notice: Subject to any disclaimer, the term of this patent is extended or adjusted under 35 U.S.C. 154(b) by 36 days.

(21) Appl. No.: 15/105,991

(22) PCT Filed: Dec. 19, 2014

(86) PCT No.: PCT/GB2014/053796
§ 371 (c)(1),
(2) Date: Jun. 17, 2016

(87) PCT Pub. No.: WO2015/092433
PCT Pub. Date: Jun. 25, 2015

(65) Prior Publication Data
US 2017/0005211 A1    Jan. 5, 2017

(30) Foreign Application Priority Data
Dec. 19, 2013 (GB) .................................. 1322572.7

(51) Int. Cl.
*H01L 31/0224* (2006.01)
*H01G 9/20* (2006.01)
(Continued)

(52) U.S. Cl.
CPC ... *H01L 31/022425* (2013.01); *H01G 9/2081* (2013.01); *H01L 31/0465* (2014.12);
(Continued)

(58) Field of Classification Search
CPC .. H01L 31/0465; H01L 31/046; H01G 9/2081
See application file for complete search history.

(56) References Cited

U.S. PATENT DOCUMENTS 4,243,432 A * 1/1981 Jordan ............... H01L 31/03365
136/244
4,754,544 A    7/1988 Hanak
(Continued)

FOREIGN PATENT DOCUMENTS

EP    2427910 A2    3/2012
FR    2972299 A1    9/2012
(Continued)

*Primary Examiner* — Eli S Mekhlin
(74) *Attorney, Agent, or Firm* — Harness, Dickey & Pierce, P.L.C.

(57) ABSTRACT

An optoelectronic device has a layered construction, comprising a base layer, a first conductive layer, a photoactive layer and a second conductive layer. Plural separation channels extending through the photoactive layer and the first conductive layer separate the photoactive layer into photoactive regions, and insulator material extends through the respective separation channels to the base layer. Between adjacent photoactive regions, electrical connectors extend inside the lateral extent of the insulator material between a surface of a second electrode that is in electrical contact with one photoactive region to an opposing surface of a first electrode that is in electrical contact with the other photoactive region. By forming the electrical connectors extend inside the lateral extent of the insulator material, the overall size of the connection is minimized.

19 Claims, 8 Drawing Sheets

(51) Int. Cl.
  *H01L 31/0465* (2014.01)
  *H01L 31/18* (2006.01)
  *H01L 51/44* (2006.01)

(52) U.S. Cl.
  CPC ............ *H01L 31/18* (2013.01); *H01L 51/441* (2013.01); *Y02E 10/542* (2013.01); *Y02P 70/521* (2015.11)

(56) References Cited

U.S. PATENT DOCUMENTS

| | | | | |
|---|---|---|---|---|
| 5,348,589 | A * | 9/1994 | Arai | H01L 31/03921 |
| | | | | 136/244 |
| 5,538,902 | A * | 7/1996 | Izu | H01L 31/0352 |
| | | | | 136/244 |
| 6,265,652 | B1 * | 7/2001 | Kurata | H01L 31/022466 |
| | | | | 136/244 |
| 2008/0115821 | A1 | 5/2008 | Xu et al. | |
| 2008/0314439 | A1 * | 12/2008 | Misra | H01L 31/1876 |
| | | | | 136/249 |
| 2012/0048333 | A1 | 3/2012 | Karpenko et al. | |

FOREIGN PATENT DOCUMENTS

| | | |
|---|---|---|
| FR | 2985606 A1 | 7/2013 |
| WO | WO-92-07386 A1 | 4/1992 |
| WO | WO-2010-113880 A1 | 10/2010 |
| WO | WO-2011-048352 A1 | 4/2011 |
| WO | WO-2013-171517 A1 | 11/2013 |
| WO | WO-2013-171518 A1 | 11/2013 |
| WO | WO-2013-171520 A1 | 11/2013 |

\* cited by examiner

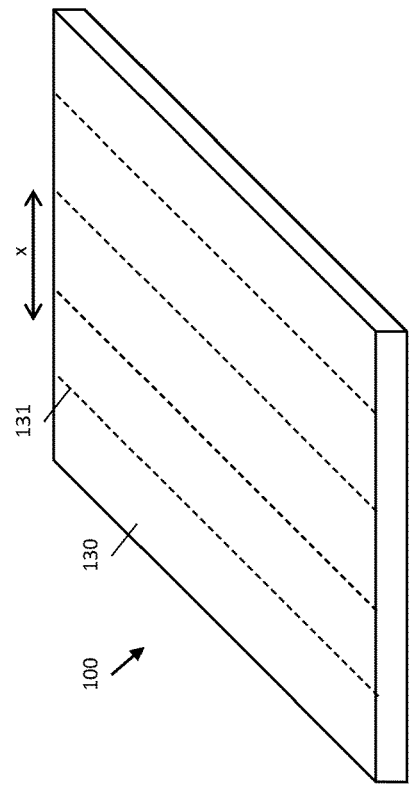
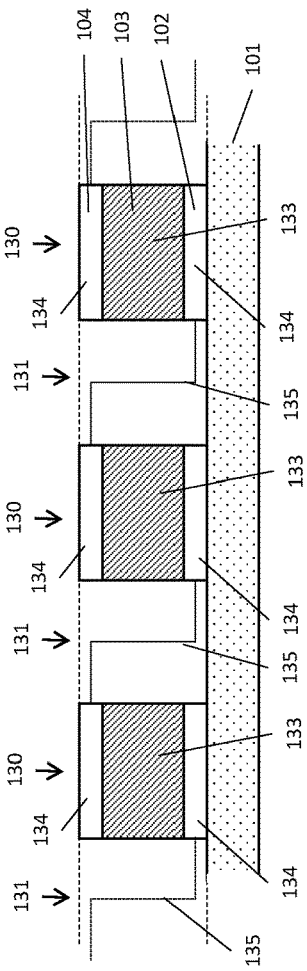
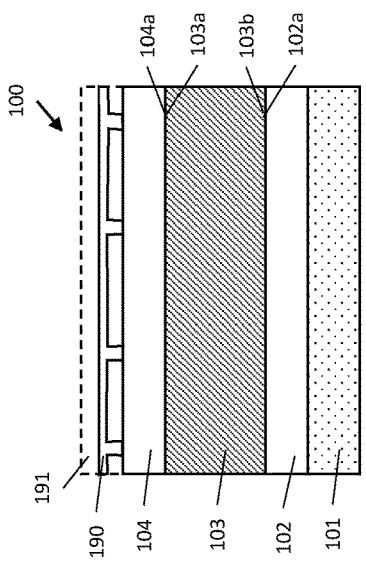
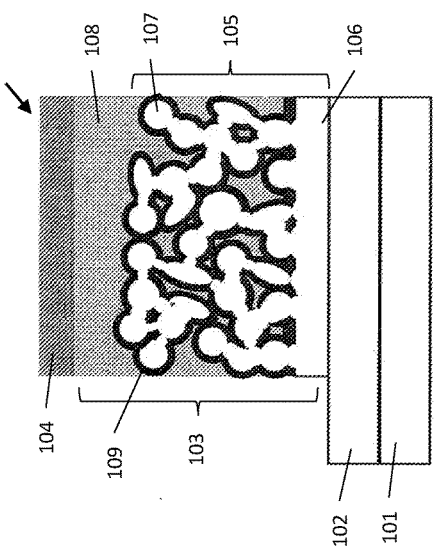

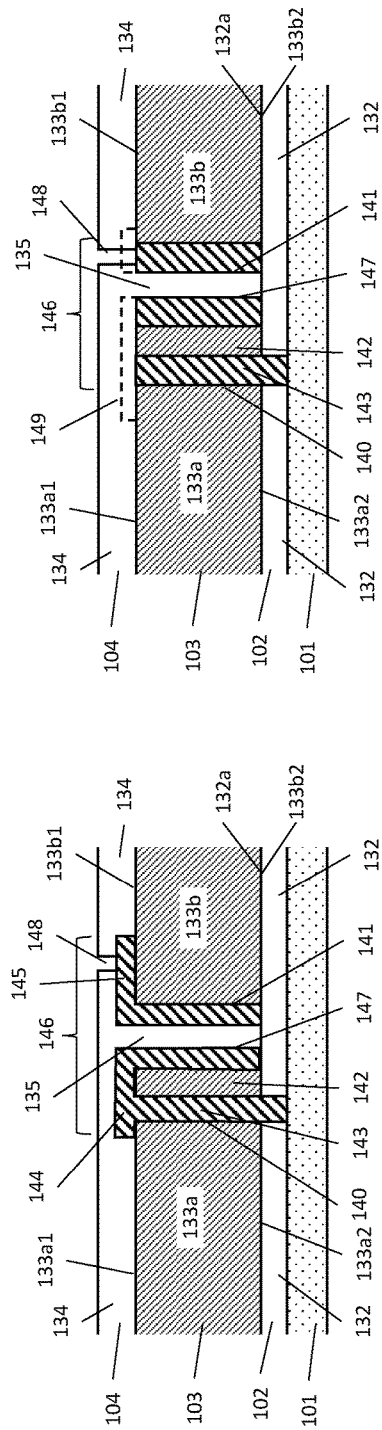
Figure 5
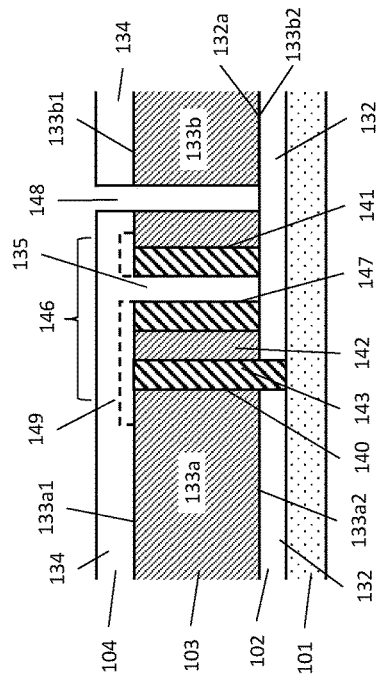
Figure 10
Figure 11

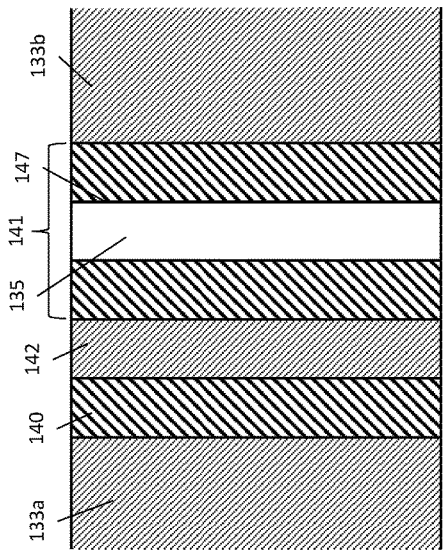
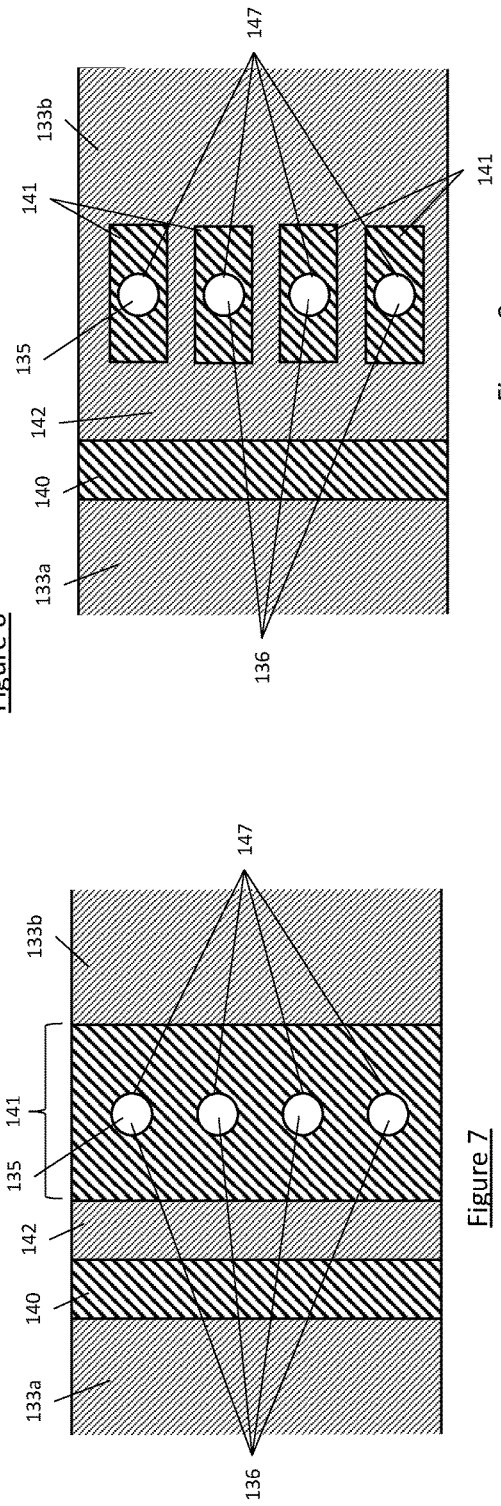

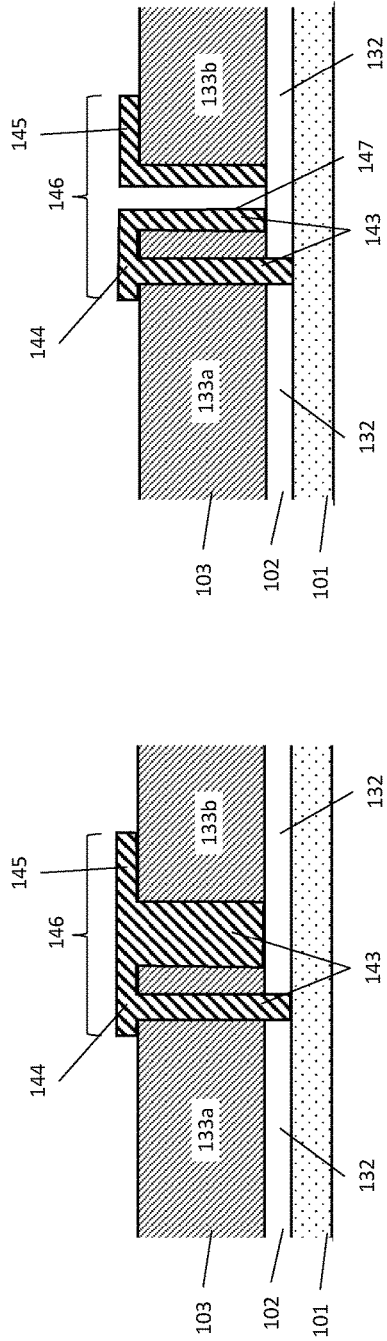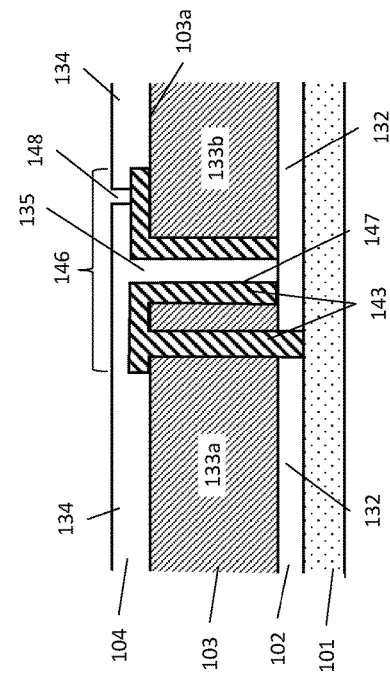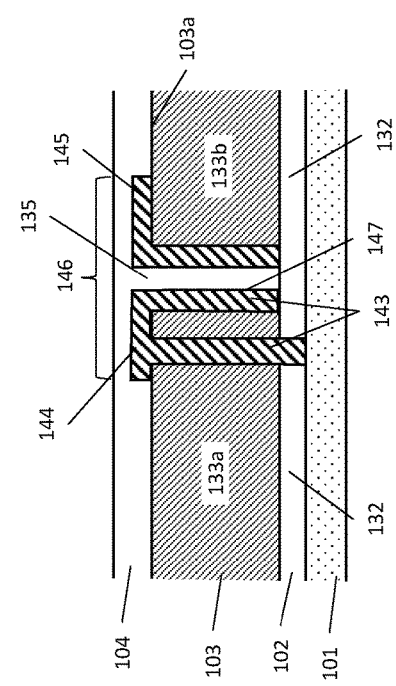

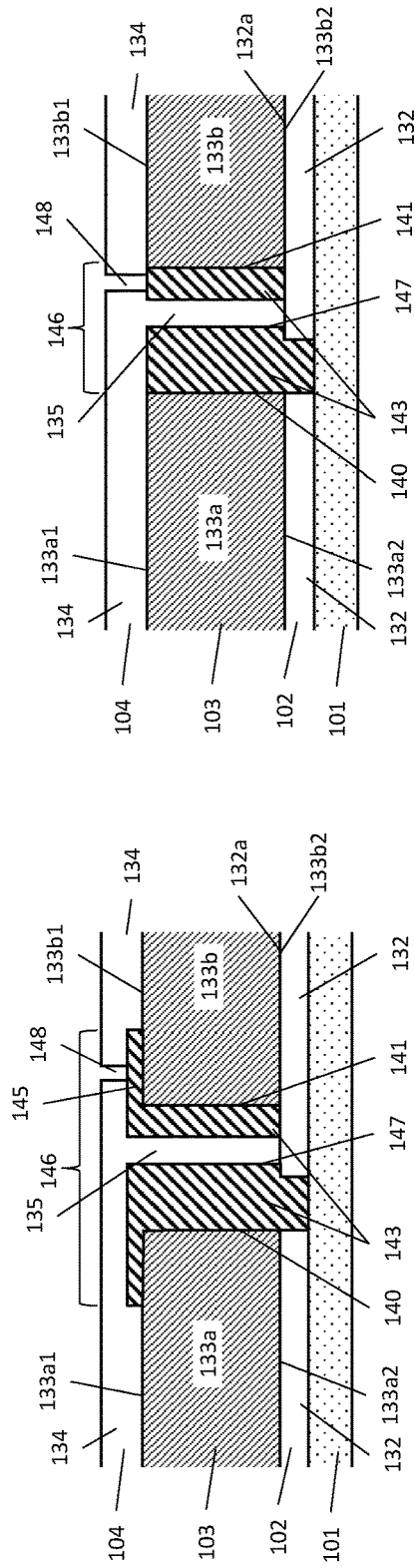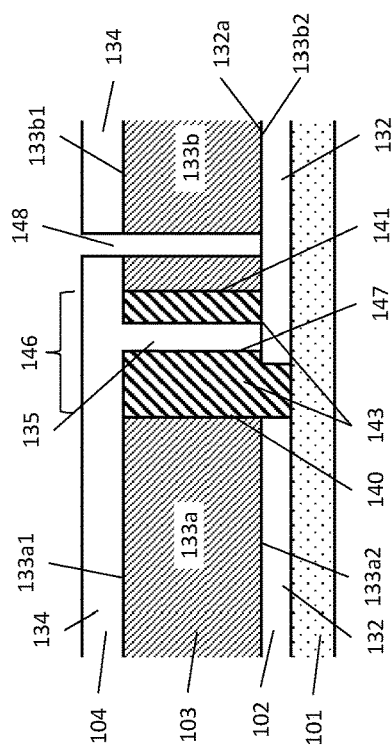
Figure 12
Figure 13
Figure 14

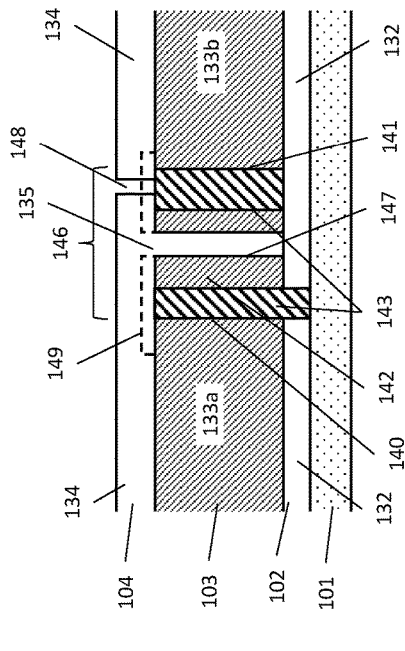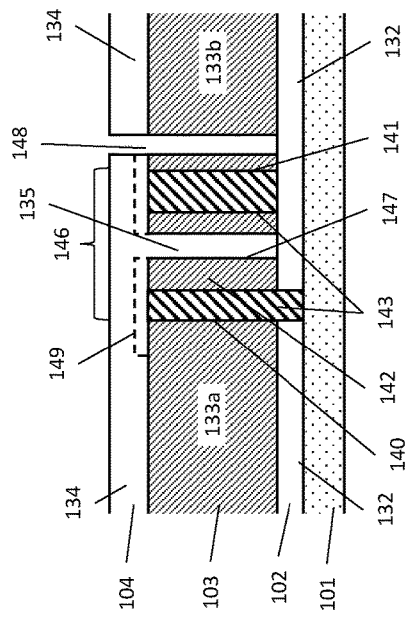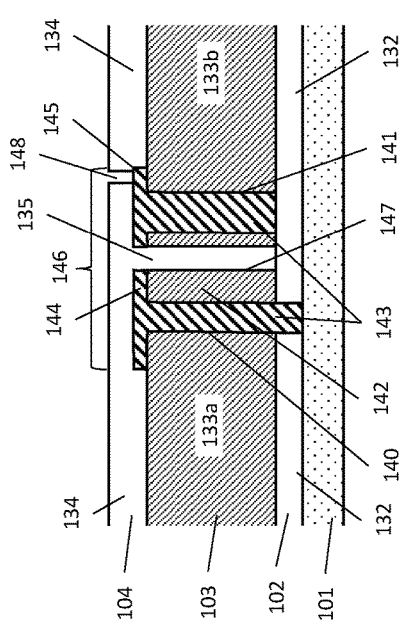

CONNECTION OF PHOTOACTIVE REGIONS IN AN OPTOELECTRONIC DEVICE

CROSS-REFERENCE TO RELATED APPLICATIONS

This application is a 371 U.S. National Stage of International Application No. PCT/GB2014/053796, filed Dec. 19, 2014, which claims the benefit of and priority to British Patent Application No. 1322572.7, filed Dec. 19, 2013. The entire disclosures of the above applications are incorporated by reference herein.

The present invention relates to the manufacture of an optoelectronic device, for example a photovoltaic device.

The present invention relates to an optoelectronic device having a layered construction. Such an optoelectronic device may comprise a base layer, a first conductive layer on the base layer, a photoactive layer on the first conductive layer and a second conductive layer on the photoactive layer, the conductive layers being in electrical contact with the photoactive layer.

With such an optoelectronic device limitations on the potential difference across the photoactive layer can make it desirable to separate the photoactive layer into photoactive regions and similarly to separate the conductive layer into electrodes in electrical contact with respective photoactive regions, to form photoactive cells. In that case, electrical connectors may be provided within the layered structure between individual photoactive cells. In this manner, a string of photoactive cells may be connected in series to provide the required overall potential difference across the entire string of connected photoactive cells.

The method of formation of the electrical connectors typically involves processing steps of removal and/or deposition of material within the layered construction, using techniques that are known in themselves. Such processing is desired to be as simple and cost-effective as possible.

By way of example, WO-2011/048352 discloses a number of methods of forming such electrical connectors in an optoelectronic device. Some of these methods involve formation of separation channels extending through the photoactive layer and the first conductive layer to separate the photoactive layer into photoactive regions and to separate the first conductive layer into first electrodes in electrical contact with respective photoactive regions. Insulator material fills the respective separation channels extending through to the base layer. The electrical connectors from the second conductive layer to the first conductive layer are provided by depositing conductive material that extends across the top of the insulator material and through a further interconnection channel formed in the photoactive layer.

However such electrical connectors are made, their processing inevitably results in some of the photoactive layer being made ineffective, by being removed or becoming electrically isolated, which reduces the effective surface area of the optoelectronic device reducing the effectiveness of the device. Similarly, the structure formed to provide such electrical connectors may further create visible markings that mar the aesthetic appearance of the optoelectronic device.

The present invention is concerned with formation of electrical connectors between the electrodes of that provides a good compromise between on one hand simplicity of processing and on the other hand minimisation of the size and/or visibility of the electrical connectors.

According to a first aspect of the present invention, there is provided an optoelectronic device having a layered construction, comprising:
a base layer;
a first conductive layer on the base layer;
a photoactive layer on the first conductive layer and in electrical contact therewith;
plural separation channels extending through the photoactive layer and the first conductive layer, wherein, on opposite sides of the separation channels, the photoactive layer is separated into photoactive regions and the first conductive layer is separated into first electrodes in electrical contact with respective photoactive regions;
between adjacent photoactive regions, insulator material extending at least through the respective separation channels to the base layer;
a second conductive layer on the photoactive layer and in electrical contact therewith separated into second electrodes in electrical contact with respective photoactive regions by gaps extending through the second conductive layer; and
between adjacent photoactive regions, respective electrical connectors extending inside the lateral extent of the insulator material between a surface of a second electrode that is in electrical contact with one of the adjacent photoactive regions and an opposing surface of a first electrode that is in electrical contact with the other of the adjacent photoactive regions.

Each of the respective electrical connectors therefore extends between surfaces of the second electrode and the first electrode that are opposite/face one another. Each of the respective electrical connectors is therefore disposed entirely between the second electrode that is in electrical contact with one of the adjacent photoactive regions and the first electrode that is in electrical contact with the other of the adjacent photoactive regions.

Such an optoelectronic device may be manufactured in a simple cost-effective manner by using processing steps of removal and/or deposition of material within the layered construction. Such processing steps may use techniques that are known in themselves. For example, the separation channels may be formed by techniques that are known in themselves for example laser etching, mechanical scribing, chemical etching or plasma etching. Similarly, the insulator material and/or the electrical connectors may be provided by known deposition techniques for example a printing technique, such as screen printing, inkjet printing, gravure or offset printing, or pre-metered extrusion deposition.

In accordance with the present invention, the electrical connectors, which extend between a surface of a second electrode that is in electrical contact with one of the adjacent photoactive regions to and an opposing surface of a first electrode that is in electrical contact with the other of the adjacent photoactive regions, extends inside the lateral extent of the insulator material. Compared to a structure in which the electrical connectors are formed by conductive material extending across the top of the insulator material/second conductive layer and through an interconnection channel formed in the photoactive layer, the provision of the electrical connectors inside the lateral extent of the insulator material provides a significant advantage in reducing the overall size and visual impact of the structure formed to provide the electrical connectors.

With typical processing techniques, the electrical connector can be provided in a lateral width that is narrow compared to the lateral extent of the insulator material. The insulator material is typically provided by a deposition technique which may be inaccurate and/or provide difficulties in minimising the spread of the insulator material. In contrast, the lateral width of the electrical connectors is controlled by a removal process. A removal process may be selected that is more accurate and provides an electrical connector that is narrower than the lateral extent of the insulator material. For example, the electrical connectors may deposited within interconnection channels, in which case their lateral width is governed by the removal process used to form the interconnection channels. For example, if an interconnection channel is formed by laser etching, then typically it is possible to provide an electrical connector that has a lateral width of the order of ⅓ of the lateral extent of insulator material formed by a typical deposition process.

The comparative reduction in the overall size of the structure formed to provide the electrical connectors achieved by provision of the electrical connectors inside the lateral extent of the insulator material may reduce the amount of the photoactive layer that is made ineffective, by removing or isolating less of the photoactive layer. This reduces the loss of the effective surface area of the optoelectronic device, which loss would reduce the effectiveness of the device. Alternatively or additionally, this may reduce the structure that provides the electrical connectors, thereby reducing the visual impact of the electrical connectors and enhancing the aesthetic qualities of the optoelectronic device.

Further according to the present invention, there is provided a method of making such an optoelectronic device.

For example, according to a second aspect of the present invention, there is provided a method of manufacturing an optoelectronic device, comprising:

providing a base layer;

depositing a first conductive layer on the base layer;

depositing a photoactive layer on the first conductive layer and in electrical contact therewith;

forming plural separation channels extending through the photoactive layer and the first conductive layer that separate the photoactive layer into photoactive regions and that separate the first conductive layer into first electrodes in electrical contact with respective photoactive regions;

depositing, between adjacent photoactive regions, insulator material extending at least through the respective separation channels to the base layer;

forming a second conductive layer on the photoactive layer and in electrical contact therewith separated into second electrodes in electrical contact with respective photoactive regions by gaps extending through the second conductive layer, and between adjacent photoactive regions, respective electrical connectors extending through the insulator material between a surface of a second electrode that is in electrical contact with one of the adjacent photoactive regions and an opposing surface of a first electrode that is in electrical contact with the other of the adjacent photoactive regions.

Such a method provides the same advantages as discussed above with respect to the first aspect of the present invention.

Alternatively according to the first aspect of the present invention, there is provided an optoelectronic device having a layered construction, comprising:

a base layer;

a first conductive layer on the base layer;

a photoactive layer on the first conductive layer and in electrical contact therewith;

plural separation channels extending through the photoactive layer and the first conductive layer, wherein, on opposite sides of the separation channels, the photoactive layer is separated into photoactive regions and the first conductive layer is separated into first electrodes in electrical contact with respective photoactive regions;

between adjacent photoactive regions, insulator material extending at least through the respective separation channels to the base layer;

a second conductive layer on the photoactive layer and in electrical contact therewith separated into second electrodes in electrical contact with respective photoactive regions by gaps extending through the second conductive layer; and between adjacent photoactive regions, respective electrical connectors extending inside the lateral extent of the insulator material from a second electrode in electrical contact with one of the adjacent photoactive regions to a first electrode in electrical contact with the other of the adjacent photoactive regions.

Alternatively according to the second aspect of the present invention, there is provided a method of manufacturing an optoelectronic device, comprising:

providing a base layer;

depositing a first conductive layer on the base layer;

depositing a photoactive layer on the first conductive layer and in electrical contact therewith;

forming plural separation channels extending through the photoactive layer and the first conductive layer that separate the photoactive layer into photoactive regions and that separate the first conductive layer into first electrodes in electrical contact with respective photoactive regions;

depositing, between adjacent photoactive regions, insulator material extending at least through the respective separation channels to the base layer;

forming a second conductive layer on the photoactive layer and in electrical contact therewith separated into second electrodes in electrical contact with respective photoactive regions by gaps extending through the second conductive layer, and between adjacent photoactive regions, respective electrical connectors extending through the insulator material from a second electrode in electrical contact with one of the adjacent photoactive regions to a first electrode in electrical contact with the other of the adjacent photoactive regions.

Embodiments of the present invention will now be described by way of non-limitative example with reference to the accompanying drawings, in which:

FIG. 1 is a cross-sectional side view of an optoelectronic device;

FIG. 2 is a cross-sectional side view of a specific example of the optoelectronic device;

FIG. 3 is a perspective view of the optoelectronic device;

FIG. 4 is a cross-sectional side view of the optoelectronic device schematically illustrating electrical connectors between photoactive regions;

FIG. 5 is a cross-sectional side view of a portion of the optoelectronic device at a location where two photoactive regions are connected;

FIGS. 6 to 8 are cross-sectional plan views of alternative constructions of the portion of the optoelectronic device, taken along line I-I in FIG. 5;

FIGS. 9a to 9h illustrate the portion of the optoelectronic device of FIG. 5 during successive stages of a manufacturing method; and FIGS. 10 to 19 are cross-sectional side views of the portion of the optoelectronic device at a location where two photoactive regions are connected by a modified structure.

Figure 9B:
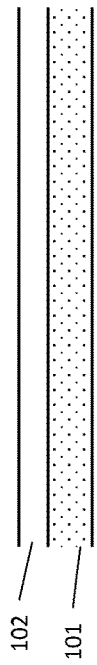
Figure 9D:
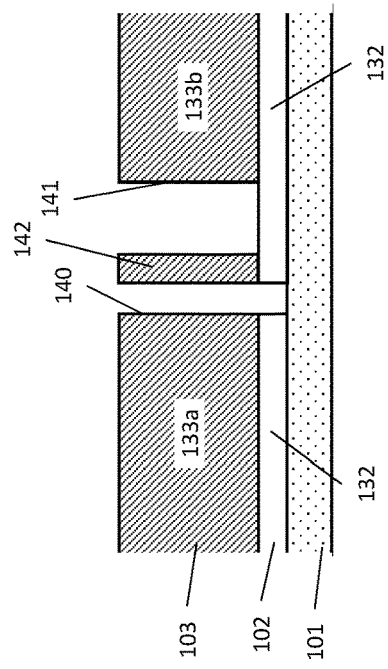

An optoelectronic device 100 is shown in FIG. 1 and has the following layered construction. The optoelectronic device 100 may be a photovoltaic device that converts incident solar electromagnetic (EM) radiation into electrical current. The solar radiation may be light in the visible spectrum or EM radiation in other parts of the spectrum. The optoelectronic device 100 may be a light-emitting device that emits light (or other EM radiation) under application of an electrical voltage, for example a light-emitting diode.

The optoelectronic device 100 comprises a base layer 101 which acts as a support for the other layers. The base layer 101 may be made of any suitable material, for example glass.

A first conductive layer 102 is deposited on the base layer 101. The first conductive layer 102 may be made of any suitable conductive material, for example a conductive oxide such as doped tin dioxide ($SnO_2$), a metal, or a conducting polymer.

A photoactive layer 103 is deposited on the first conductive layer 102. The photoactive layer 103 converts light into electrical current or electrical current into light, depending on whether the optoelectronic device 100 is a photovoltaic device light or a light-emitting device. The photoactive layer 103 may be any suitable type of photoactive layer, as described further below.

A second conductive layer 104 is deposited on the photoactive layer 103. The second conductive layer 104 may be made of any suitable conductive material, for example a conductive oxide such as doped tin dioxide ($SnO_2$), a metal, or a conducting polymer.

Where the second conductive layer 104 is made of a material having an insufficient conductivity, the optoelectronic device 100 may optionally further comprise conductive grids 190 having a higher conductivity than the second conductive layer 14. Each cell (described below) has a conductive grid 190, extending across the respective second electrode of the cell, and in electrical contact therewith in multiple locations.

Optionally, the optoelectronic device 100 may optionally further comprise a protective layer 191 formed on top of the remainder of the optoelectronic device 100 for protection. The protective layer 191 may be formed of any suitable material for example glass or a polymer. The protective layer 191 may be transparent.

The upper 103a and lower surfaces 103b of the photoactive layer 103 are in physical contact with the upper surface 102a of the first conductive layer 102 and upper surface 104a of the second conductive layer 104, respectively, so that the photoactive layer 103 is in electrical contact with the first conductive layer 102 and the second conductive layer 104. This is for the purpose of receiving current generated in the photoactive layer 103 or applying a voltage across the photoactive layer 103, depending on whether the optoelectronic device 100 is a photovoltaic device light or a light-emitting device In FIG. 1 and the various other drawings showing cross-sectional views of an optoelectronic device 100, for the sake of clarity the relative thickness of the various layers is not drawn to scale. The layers may in fact have thicknesses that are typical for the type of photoactive layer 103.

The photoactive layer 103 may comprise any photoactive material in a suitable construction that may include other materials appropriate to the utilise the photoactive material.

The photoactive layer 103 may be one that is transparent to visible light (by which is meant that the photoactive layer 103 has sufficient transparency to allow a person to see through it. This has the advantage of allowing the optoelectronic device 1 to be formed on a window. In this case, the base layer 101 is selected to be transparent for example glass, and the first and second conductive layers 102 and 103 are is selected to be transparent for example fluorine doped tin oxide (FTO). However, transparency of all of the various layers in the optoelectronic device 1 is not essential and some or all of the layers may be opaque.

The photoactive layer 103 may comprise a photoactive perovskite. Such a perovskite may generally be one which is capable of (i) absorbing EM radiation, and thereby generating free charge carriers; and/or (ii) emitting light (or other EM radiation), by accepting charge, both electrons and holes, which subsequently recombine and emit light. Thus, the perovskite may be a light-absorbing and/or a light-emitting perovskite. Suitable perovskites include organometal perovskites, and particularly organometal halide perovskites, such as those described in WO 2013/171517, WO 2013/171518 and WO/2013/171520.

In some embodiments, the photoactive layer may comprise photoactive material disposed between: an n-type region comprising at least one n-type material; a p-type region comprising at least one p-type material. In this case, the photoactive material may be a perovskite, as described above. Alternatively, it may be a semiconductor other than a perovskite, such as: a copper zinc tin sulphide such as $Cu_2ZnSnS_4$ (CZTS); a copper zinc tin sulphur-selenide such as $Cu_2ZnSn(S_{1-x}Se_x)_4$ (CZTSSe); a copper indium gallium selenide such as $CuIn_{1-x}Ga_xSe_2$ (CIGS); an antimony or bismuth chalcogenide, such as, for example, $Sb_2S_3$, $Sb_2Se_3$, $Bi_2S_3$ or $Bi_2Se_3$; a dye-sensitised metal oxide such as dye-sensitised $TiO_2$; or an organic photosensitizing dye, such as for instance an indolene dye.

The term "n-type material" refers to an electron-transporting semiconductor material. Any suitable electron-transporting material may be employed. Typically, however, the n-type material may comprise perovskite, titanium dioxide ($TiO_2$) or tin dioxide ($SnO_2$).

The term "p-type material" refers to a hole-transporting semiconductor material. Suitable p-type materials may be selected from organic or inorganic materials such as polymeric or molecular hole transporters or semiconducting metal oxides or halides. The p-type layer may for instance comprise spiro-OMeTAD (2,2',7,7'-tetrakis-(N,N-di-p-methoxyphenylamine)9,9'-spirobifluorene)). The p-type layer may for instance comprise CuSCN.

FIG. 2 shows a specific example of the optoelectronic device 100 in the case that the photoactive layer 103 comprises a photoactive perovskite, having the following construction.

The base layer 101 is made of glass. The first conductive layer 102 is made of fluorine-doped tin oxide (FTO), $SnO_2$:F, typically having a thickness in the range 100-500 nm or of that order. The second conductive layer 104 is made of a metal such as Ag, Au, Cu, Al, Ni, or else a transparent conductor such as a conducting polymer or metal oxide.

The photoactive layer 103 comprises an n-type region 105 formed by a compact hole blocking layer 106 of titanium dioxide, typically of thickness of the order 100 nm, and by a mesoporous layer 107 of a metal oxide such as titania or alumina, typically of thickness in the range 0.5-1.5 μm or of that order, in an open structure having a relatively large surface area. The photoactive layer 103 further comprises a p-type region 108 formed comprising a hole-transporting material which may of the type described above. The photoactive layer 103 further comprises a photoactive perovskite 109 within the mesoporous layer 107, and therefore disposed between the n-type region 105 and the p-type region 108.

FIG. 3 shows the optoelectronic device 100 in an example wherein it has a rectangular shape, which is most convenient for many applications, although in general the optoelectronic device 100 may be of any size and shape.

As shown in FIG. 3, the optoelectronic device 100 may be divided into a string of photovoltaic cells 130 distributed in a lateral direction x across the optoelectronic device 100. Five photoactive cells 130 are shown in FIG. 3 but in general there may be any number of photoactive cells 130. The photoactive cells 130 are formed by separating the layers along the locations 131 shown by dotted lines.

FIG. 4 schematically illustrates the separation of the layers of the optoelectronic device 100 to form the cells 130 and the electrical connections therebetween. As shown in FIG. 4, in locations 131 the photoactive layer 103 is separated into photoactive regions 133 that are electrically isolated from each other. In this context, "electrically isolated" means that electrical isolation is sufficient to allow the photoactive regions 133 to operate independently. Similarly, in locations 131 the first conductive layer 102 is separated into first electrodes 132 that are in electrical contact with respective photoactive regions 133, but are electrically isolated from each other. Likewise, the second conductive layer 104 is separated into second electrodes 134 that are in electrical contact with respective photoactive regions 133, but are electrically isolated from each other. Each photoactive region 133 and the first electrode 132 and second electrode 134 are electrically connected thereto together form one of the photoactive cells 130.

In each location 131, there is further formed a respective electrical connector 135 extending between the second electrode 134 that is in electrical contact with one photoactive region 133 (on the left side of the electrical connector 135 in FIG. 4) and the first electrode 132 that is in electrical contact with an adjacent photoactive region (on the right side of the electrical connector 135 in FIG. 4). In this manner, the electrical connectors 135 provide connection of the photoactive regions 133 of the photoactive cells 130 in series laterally across the optoelectronic device 100. This series connection allows operation of the optoelectronic device 100 with an overall potential difference across the entire string of photoactive cells 130 that is the sum of the potential difference across the individual photoactive regions 133 of the photoactive cells 130. Thus, for a given type and configuration of the photoactive layer 103, the number of photoactive cells 130 may be chosen to provide the required overall potential difference.

The structure used in locations 131 to provide the separation and electrical isolation of the photoactive regions 133, and the electrical connectors 135 will now be described.

FIG. 5 shows one possible structure of a portion of the optoelectronic device 100 at one of the locations 131 between two adjacent photoactive regions 133 referred to as the first and second photoactive regions 133*a* and 133*b*.

A separation channel 140 extends through the photoactive layer 103 and the first conductive layer 102. On opposite sides of the separation channel 140, the photoactive layer 103 is separated into the photoactive regions 133*a* and 133*b* that are electrically isolated, and the first conductive layer 102 is separated into the first electrodes 132 that are electrically isolated.

In addition, an insulator channel 141 extends through the photoactive layer 103. In this structure, the insulator channel 141 is separated from the separation channel 140 by a region 142 of the photoactive layer 103.

The separation channel 140 extends along the entirety of the photoactive layer 103 along the length of location 131 (i.e. transverse to the lateral direction) to provide the desired separation and electrical isolation.

Insulator material 143 is provided between the photoactive regions 133*a*, 133*b*, in particular filling the separation channel 140 extending through to the base layer 101 and also filling the insulator channel 141 extending through to the first conductive layer 102. The insulator material 143 has a lateral extent 146 that is governed by the deposition process used to deposit it, as described further below. In this structure, the insulator material 143 overlaps the photoactive layer 103. Thus, the insulator material 143 includes a first overlap portion 144 that overlaps the region 142 of the photoactive layer 103 in the separation channel 140 and the insulator channel 141. Similarly, the insulator material 143 includes a second overlap portion 145 that overlaps the second photoactive region 133*b*.

An interconnection channel 147 extends through the insulator material 143 in the insulator channel 141 to the first electrode 132 that is in electrical contact with the second photoactive region 133*b*. In the illustrated embodiment, the interconnection channel 147 is substantially perpendicular relative to each of the first conductive layer 102, the photoactive layer 103, and the second conductive layer 104.

The insulator material 143 provides electrical insulation between the photoactive cells 130 and prevents shorting. A material is chosen that is capable of providing this function, and is further capable of penetrating to the bottom of the separation channel 140 and the insulator channel 141 in the deposition step during manufacture, as described below. The width of the separation channel 140 and the insulator channel 141 may also be selected to assist penetration of the insulator material 143.

The second conductive layer 104 is formed over the photoactive layer 103 and the insulator material 143. The second conductive layer 104 is separated into the second electrodes 134 by a gap 148 that overlies the second overlap portion 145 and extends through the second conductive layer 104. The gap 148 extends along the entirety of the photoactive layer 103 along the length of location 131 (i.e. transverse to the lateral direction) to separate and electrically isolate the second electrodes 134.

In this structure, the gap 148 extends to the insulator material 143 of the second overlap portion 145 which is sufficient to provide the required separation and electrical isolation of the second electrodes 134. Optionally, the gap 148 could extend further into the second overlap portion 145 or further still into the photoactive layer 103. However, if the gap 148 does not extend into the photoactive layer 103, as is the case in this example, then the aesthetic appearance is improved because a gap 148 extending into the photoactive layer 103 is more visible due to the absorption of light due to its photoactive properties.

Optionally, the gap 148 could be filled with a further insulator material, but this is not essential.

The electrical connector 135 is formed by conductive material filling the interconnection channel 147 and therefore extending through the insulator material 143 that is in the insulator channel 141 in this example. The electrical connector 35 extends from the lower surface 134*a* of the second electrode 134 that is in electrical contact with the upper surface 133*a*1 of the first photoactive region 133*a* to the upper surface 132*a* of the first electrode 132 that is in electrical contact with the lower surface 133*b*2 of the second photoactive region 133*b*.

The electrical connector 135 (i.e. the conductive material forming the electrical connector) therefore extends between and is in electrical contact with the surfaces of the second electrode 134 and the first electrode 132 that are opposite/face one another. The electrical connector 135 is therefore disposed entirely between the second electrode 134 that is in electrical contact with the first photoactive region 133a and the first electrode 132 that is in electrical contact with the adjacent second photoactive region 133b. Consequently, in this embodiment, the second electrode 134 extends over the insulator channel 141/the interconnection channel 147 through which the electrical connector 135 extends.

The conductive material of the electrical connector 135 may be the same material as the second conductive layer 104, allowing deposition in the same processing step as described below, but this is not essential.

The insulator channel 141 electrically insulates the electrical connectors 135 from the second photoactive region 133b. As the electrical connector 135 extends through the insulator material 143 that is in the insulator channel 141, the electrical connector 135 extends inside the lateral extent 146 of the insulator material 143. This minimises the overall size of the structure. The minimal size minimises the amount of the photoactive layer 103 that is made ineffective, being in this structure just the material removing to form the separation channel 140 and the insulator channel 141 and the region 142. This minimises the loss of the effective surface area of the optoelectronic device 1, which would otherwise reduce its effectiveness. The minimal size also minimises the visual impact of the electrical connectors 135, thereby enhancing the aesthetic qualities of the optoelectronic device 100.

Along the length of location 131 (i.e. transverse to the lateral direction x), the insulator channel 141, the interconnection channel 147 and the electrical connector 135 may take the form shown in FIG. 6, that is each extending along the along the entirety of the separation channel 140. This maximises the cross-sectional areas of the electrical connector 135.

Alternatively, the optoelectronic device 100 may be modified to take one of the forms shown in FIG. 7 or FIG. 8, in each of which the interconnection channel 147 is modified so that the electrical connector 135 comprise a plurality of separate strands 136 (four strands 36 being illustrated, but any number being possible). In the case of FIG. 7, the insulator channel 141 each extend along the along the entirety of the separation channel 140. In the case of FIG. 8, there are plural separate insulator channels 141 each surrounding one of the strands 136 of the electrical connector 135.

A method of manufacturing the optoelectronic device 100 with the construction shown in FIG. 5 comprises the following sequence of steps which build up the optoelectronic device 100 as shown in FIGS. 9a to 9h.

Figure 9A:
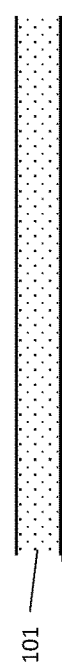
Figure 9C:
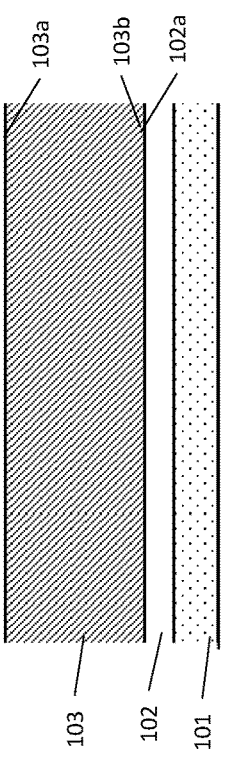

In a first step, the base layer 101 is provided (FIG. 9a).

In a second step, the first conductive layer 102 is deposited on the base layer 101 (FIG. 9b). The first conductive layer 102 may extend across the entirety of the base layer 101, or an outer rim of the base layer 101 may be left uncovered.

The first conductive layer 102 may be deposited by any conventional deposition technique, for example a vapour deposition method such as sputtering, a spraying technique, a printing technique, such as screen printing, inkjet printing, gravure or offset printing, or pre-metered extrusion deposition.

In a third step, the photoactive layer 103 is formed on the first conductive layer 102 in electrical contact therewith (FIG. 9c), with the lower surface 103b of the photoactive layer 103 in physical contact with the upper surface 102a of the first conductive layer 102. This photoactive layer 103 may be formed using techniques appropriate to the nature of the photoactive material selected. The photoactive layer 103 may extend across the entirety of the first conductive layer 102.

In a fourth step, the separation channels 140 and the insulator channels 141 are formed (FIG. 9d), although these may alternatively be formed in separate steps. Any suitable removal process may be used, for example laser etching, mechanical scribing, chemical etching, plasma etching. The separation channels 140 and the insulator channels 141 are formed in the configuration described above, that is with the separation channels 140 extending through the photoactive layer 103 and the first conductive layer 102 and the insulator channels 141 extending through the photoactive layer 103 to the first conductive layer 102. Thus, as described above, the separation channels 140 separate the photoactive layer 103 into the photoactive regions 133a and 133b, and also separate the first conductive layer 102 into the first electrodes 132.

In a fifth step, the insulator material 143 is deposited (FIG. 9e) between the adjacent photoactive regions 133a and 133b. The insulator material 143 fills the separation channel 140 so that it extends through to the base layer 101. The insulator material 143 also fills the insulator channel 141 extending through to the second conductive layer 102.

The insulator material 143 may be deposited by any conventional deposition technique that provides control over the location of the insulator material 143, for example a printing technique, such as screen printing, inkjet printing, gravure or offset printing, or pre-metered extrusion deposition. Typical deposition techniques typically result in the insulator material 143 having a lateral extent 146 that is larger than the lateral widths of the separation channel 140 and the insulator channel 141 that can be achieved by typical removal processes. As a result, in the absence of removing excess insulator material, the insulator material 143 overlaps the photoactive layer 103. Thus, the insulator material 143 includes a first overlap portion 144 that overlaps the region 142 of the photoactive layer 103 in the separation channel 140 and the insulator channel 141. Similarly, the insulator material 143 includes a second overlap portion 145 that overlaps the second photoactive region 133b.

In a sixth step, the interconnection channels 147 are formed (FIG. 9f). The interconnection channels 147 are formed in the configuration described above, that is extending through the insulator material 143 to the first electrode 132 that is in electrical contact with the second photoactive region 133b. Any suitable removal process may be used, for example laser etching, mechanical scribing, chemical etching, plasma etching. Notably, such removal processes may form an interconnection channel 147 having a narrower lateral extent than the lateral extent 146 of the insulator material 143.

In a seventh step, conductive material is deposited over the photoactive layer 103 to form the electrical connectors 135 by means of conductive material penetrating inside the interconnection channels 147 and to form the second conductive layer 104 by means of conductive material present on the upper surface 103a of the photoactive layer 103 (FIG. 9g). In this example, the deposition causes the second conductive layer 104 to form across the entirety of the photoactive layer 103.

The second conductive layer 104 may be deposited by any conventional deposition technique, for example a vapour deposition method such as sputtering, a spraying technique, a printing technique, such as screen printing, inkjet printing, gravure or offset printing, a solution processing method, or pre-metered extrusion deposition.

As an alternative, deposition of the electrical connectors 135 could be performed in a separate step from deposition of the second conductive layer 104. This would allow the electrical connectors 135 to be formed from a different conductive material to that which forms the second conductive layer 104, for example a material having a higher conductivity or better forming properties.

In an eighth step, the second conductive layer 104 is separated into the second electrodes 134 by forming the gaps 148 (FIG. 9h). The gaps 148 are formed in the configuration described above, that is extending through the second conductive layer 104 to the second overlap portion 145, or optionally deeper as described above. The gaps 148 are preferably located such that each of the second electrodes 134 extends over the interconnection channel 147 within which the electrical connector extends 135.

As an alternative to forming the gaps 148 in a separate step, the gaps 148 may be formed as part of the eighth step by patterning of the deposited conductive material using conventional techniques that provide patterning during deposition, for example using a printing technique, such as screen printing, inkjet printing, gravure or offset printing, or pre-metered extrusion deposition.

With typical processing techniques, the interconnection channels 147, and hence the electrical connectors 135, can be formed with a lateral width that is narrower than the smallest possible lateral extent 146 of the insulator material 143. Typical deposition techniques that may be used for the insulator material 143 may be inaccurate and/or provide difficulties in minimising the spread of the insulator material 143. In contrast, it is possible to use a removal process to form the interconnection channels 147 that is more accurate and provides an electrical connector 135 that is narrower than the lateral extent 146 of the insulator material 143. For example, if the interconnection channels 146 are formed by laser etching, then typically it is possible to provide an electrical connector 135 that has a lateral width of the order of ⅓ of the lateral extent 146 of the insulator material 143.

Furthermore, given the order in which the various steps of removal and/or deposition of material are implemented in order to manufacture an optoelectronic device as described herein it is possible to perform the this processing in an inert atmosphere, further simplifying the manufacture of the device.

FIGS. 10 to 19 illustrate some alternative structures used to form the channels and electrical connectors 135 in locations 131. These alternative structures are modified forms of the structure shown in FIG. 5. Accordingly, for brevity common elements are given common reference numerals and a description thereof is not repeated, only the modifications being described.

FIG. 10 illustrates a structure which is modified compared to FIG. 5 to provide the gap 148 overlying the insulator channel 141, the gap 148 extending to the insulator material 143, or optionally further into the insulator material 43. In this structure, the insulator material 143 may fill the separation channel 140 and the insulator channel 141 to the level of the upper surface 103a of the photoactive layer 103, as shown, so that the lateral extent 146 of the insulator material 143 extends to the edges of the separation channel 140 and the insulator channel 141. In the event that the deposition process leaves insulator material 143 above this level, the excess insulator material 143 may be removed in an additional processing step. Alternatively, the insulator material 143 may overlap the photoactive layer 103 in the same manner as in FIG. 5, as indicated by the dotted lines 149.

FIG. 11 illustrates a structure which is modified compared to FIG. 5 to provide the gap 148 extending through the second conductive layer 104 outside the lateral extent 146 of the insulator material 143. In this case, the gap 148 further extends through the photoactive layer 103 to the first conductive layer 102 to provide insulation between the second electrodes 134 that are electrically connected to the adjacent photoactive regions 133a and 133b. In this structure, the insulator material 143 has the same configuration as described above for FIG. 10.

FIGS. 12, 13 and 14 illustrate structures which are the same as the structures of FIGS. 5, 10 and 11, respectively, but modified so that the insulator channel 141 is contiguous with the separation channel 140. Thus, in these structures, the region 142 of the photoactive layer 103 is absent. In these structures, the absence of the region 142 may further reduce the lateral width of the structure used to provide the separation and electrical connection between adjacent photoactive cells 130. Conversely, these structures require a greater degree of accuracy in the formation of the separation channel 140 and the insulator channel 141.

In the structures of FIGS. 9 to 14, the electrical connector 135 and the insulator channel 141 may take the form of any of FIGS. 6 to 8.

FIGS. 15, 16 and 17 illustrate structures which are the same as the structures of FIGS. 5, 10 and 11, respectively, but modified so that the interconnection channels 147 are formed in the region 142 of the photoactive layer 103 between the separation channel 140 and the insulator channel 141. Thus, the electrical connections 135 extend through the region 142 of the photoactive layer 103 and through the first overlap region 144. This means that the electrical connections 135 extend through the photoactive layer 103 rather than through the insulator material 143 inside insulator channel 141, but still inside the lateral extent 146 of the insulator material 143.

Nonetheless, the insulator channel 141 performs a similar function of electrically insulating the electrical connectors 135 from the second photoactive region 133b. In the structures of FIGS. 15 to 17, the electrical connector 135 and the insulator channel 141 may take the form of either of FIG. 6 or 7 but with the electrical connector 135 in region 142, not in the insulator channel 141. In that case, the region 142 of the photoactive layer 103 in which the electrical connectors 135 are formed is electrically isolated from the remainder of the photoactive layer 103 between the separation channel 140 and the insulator channel 141.

However, in the structures of FIGS. 15 to 17, the electrical connector 135 and the insulator channel 141 desirably do not take the form of FIG. 8 because in that case the plural separated insulator channels 141 do not isolate the strands 136 of the electrical connector 135 from the second photoactive region 133b.

Figure 18:
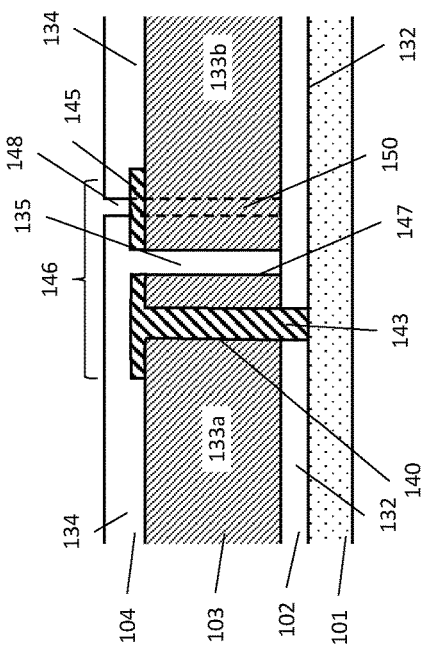

FIG. 18 illustrates a structure which is the same as the structure of FIG. 5, but modified as follows. No insulator channel 141 is provided. As in FIG. 5, the insulator material 143 overlaps the photoactive layer 103 and includes the second overlap portion 145 that overlaps the second photoactive region 133b (but no first overlap portion 144 because the region 142 of the photoactive layer is not formed). The interconnection channel 147 is formed extending through the second overlap portion 145 and through the photoactive layer 103. Thus, the electrical connections 135 extend through the second overlap portion 145 and through the photoactive layer 103. This means that the electrical connections 135 extend through the photoactive layer 103, rather than through the insulator material 143 inside an insulator channel 141, but still inside the lateral extent 146 of the insulator material 143.

In this structure, the gap 148 overlies the second overlap portion 145 and extends through the second conductive layer 103 as in FIG. 5. As shown, the gap 148 extends to the insulator material 143 of the second overlap portion 145 which is sufficient to separate and electrically isolate the second electrodes 134 in the case that the photoactive layer 103 has a sufficiently high resistance. Optionally, the gap 148 may extend further into the second overlap portion 145. Optionally, the gap 148 may further extend through the photoactive layer 103 as shown by the dotted line 150 to increase the electrical isolation between the second electrodes 134 electrically connected to the adjacent photoactive regions 133a and 133b.

Figure 19:
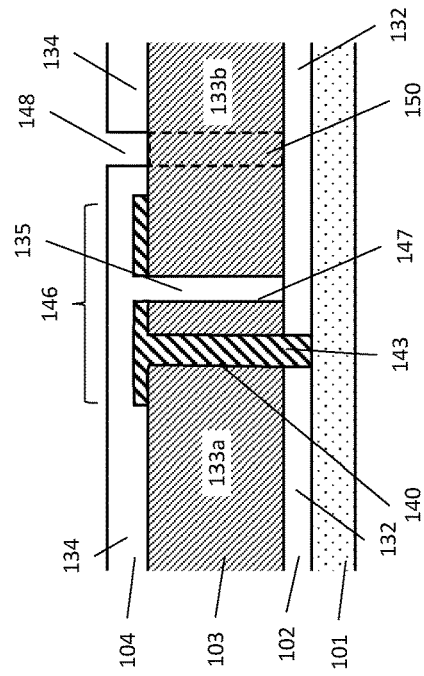

FIG. 19 illustrates a structure which is modified compared to FIG. 18 to provide the gap 148 extending through the second conductive layer 104 outside the lateral extent 146 of the insulator material 143. As shown, the gap 148 extends to the insulator photoactive layer 103 which is sufficient to separate and electrically isolate the second electrodes 134 in the case that the photoactive layer 103 has a sufficiently high resistance. Optionally, the gap 148 may further extend through the photoactive layer 103 to the first conductive layer 102 as shown by the dotted line 150 to increase the electrical insulation between the second electrodes 134 electrically connected to the adjacent photoactive regions 133a and 133b.

The alternative structures of FIGS. 10 to 19 may be manufactured by the method described above with reference to FIGS. 9a to 9h for the structure of FIG. 5, but with some modifications accordance with the modifications to the structure. Basically the same steps are performed, but the locations of some elements are slightly different and in the case of the structures of FIGS. 18 and 19 the insulator channel 141 is not formed.

The invention claimed is:

1. An optoelectronic device having a layered construction, comprising:
   a base layer;
   a first conductive layer on the base layer;
   a photoactive layer on the first conductive layer and in electrical contact therewith;
   plural separation channels extending through the photoactive layer and the first conductive layer, wherein, on opposite sides of the separation channels, the photoactive layer is separated into photoactive regions and the first conductive layer is separated into first electrodes in electrical contact with respective photoactive regions, wherein the first electrodes have first surfaces that are in physical contact with respective photoactive regions;
   between adjacent photoactive regions, insulator material extending at least through the respective separation channels to the base layer, wherein the insulator material has a lateral extent in a direction across the optoelectronic device;
   a second conductive layer on the photoactive layer and in electrical contact therewith separated into second electrodes in electrical contact with respective photoactive regions by gaps extending through the second conductive layer, wherein the second electrodes have second surfaces that are in physical contact with respective photoactive regions and oppose the first surfaces of the first electrodes; and
   between adjacent photoactive regions, respective electrical connectors extending between the second surface of the second electrode that is in physical contact with one of the adjacent photoactive regions and the first surface of the first electrode that is in physical contact with the other of the adjacent photoactive regions, inside the lateral extent of the insulator material, wherein the respective electrical connectors are in direct contact with the second surface of the second electrode and the first surface of the first electrode.

2. The optoelectronic device according to claim 1, wherein each of the respective electrical connectors is disposed entirely between the second surface of the second electrode that is in electrical contact with one of the adjacent photoactive regions and the first surface of the first electrode that is in electrical contact with the other of the adjacent photoactive regions.

3. The optoelectronic device according to claim 1, further comprising, between adjacent photoactive regions, respective interconnection channels extending between the second surface of a second electrode that is in physical contact with one of the adjacent photoactive regions and the first surface of a first electrode that is in physical contact with the other of the adjacent photoactive regions, inside the lateral extent of the insulator material, the respective electrical connectors extending through the interconnection channels, and the second electrodes extending over the respective interconnection channels.

4. The optoelectronic device according to claim 1, further comprising, between adjacent photoactive regions, at least one insulator channel extending through the photoactive layer, the insulator material between adjacent photoactive regions further extending through the respective insulator channels and the respective electrical connectors extending through the insulator material in the respective at least one insulator channel.

5. The optoelectronic device according to claim 4, wherein between adjacent photoactive regions the at least one insulator channel is any of:
   contiguous with the separation channel; and
   separated from the separation channel by a region of the photoactive layer.

6. The optoelectronic device according to claim 4, wherein between adjacent photoactive regions the at least one insulator channel comprises one of:
   plural separate insulator channels; and
   a single insulator channel extending along the entirety of the respective separation channel.

7. The optoelectronic device according to claim 6, wherein the insulator material between adjacent photoactive regions includes an overlap portion that overlaps the photoactive layer, and the electrical connectors extend through the overlap portion and the photoactive layer.

8. The optoelectronic device according to claim 7, wherein:
   the gaps are above the overlap portion and the other of the photoactive regions; or
   the gaps extend through the second conductive layer outside the lateral extent of the insulator material.

9. The optoelectronic device according to claim 4, wherein:
   the gaps are above the insulator channels; or
   the insulator material between adjacent photoactive regions includes an overlap portion that overlaps the other of the photoactive regions, and the gaps are above the overlap portion; or
   the gaps extend through the second conductive layer outside the lateral extent of the insulator material and further extend through the photoactive layer.

10. The optoelectronic device according to claim 1, further comprising, between adjacent photoactive regions, at least one insulator channel that extends through the photoactive layer, the insulator material between adjacent photoactive regions further extending through the respective at least one insulator channel, at least one region of the photoactive layer being isolated from a remainder of the photoactive layer between the at least one insulator channel and the separation channel, and the respective electrical connectors extending through the photoactive layer in the respective at least one region.

11. The optoelectronic device according to claim 10, wherein:
the gaps are above the insulator channels; or
the insulator material between adjacent photoactive regions includes an overlap portion that overlaps the other of the photoactive regions, and the gaps are above the overlap portion; or
the gaps extend through the second conductive layer outside the lateral extent of the insulator material and further extend through the photoactive layer.

12. The optoelectronic device according to claim 1, wherein the respective electrical connectors between adjacent photoactive regions comprise a plurality of separate strands.

13. The optoelectronic device according to claim 1, wherein either the second conductive layer and the electrical connectors are formed from a single conductive material, or the second conductive layer is formed from a first conductive material and the electrical connectors are formed from a second conductive material.

14. A method of manufacturing an optoelectronic device, comprising:
providing a base layer;
depositing a first conductive layer on the base layer;
forming a photoactive layer on the first conductive layer and in electrical contact therewith;
forming plural separation channels extending through the photoactive layer and the first conductive layer that separate the photoactive layer into photoactive regions and that separate the first conductive layer into first electrodes in electrical contact with respective photoactive regions, wherein the first electrodes have first surfaces that are in physical contact with respective photoactive regions;
depositing, between adjacent photoactive regions, insulator material extending at least through the respective separation channels to the base layer, wherein the insulator material has a lateral extent in a direction across the optoelectronic device; and
forming a second conductive layer on the photoactive layer and in electrical contact therewith separated into second electrodes in electrical contact with respective photoactive regions by gaps extending through the second conductive layer, wherein the second electrodes have second surfaces that are in physical contact with respective photoactive regions and oppose the first surfaces of the first electrodes, and
between adjacent photoactive regions, respective electrical connectors extending between the second surface of the second electrode that is in physical contact with one of the adjacent photoactive regions and the first surface of the first electrode that is in physical contact with the other of the adjacent photoactive regions, inside the lateral extent of the insulator material, wherein the respective electrical connectors are in direct contact with the second surface of the second electrode and the first surface of the first electrode.

15. The method of claim 14, wherein the electrical connectors are formed such that each of the respective electrical connectors is disposed entirely between the second surface of the second electrode that is in electrical contact with one of the adjacent photoactive regions and the first surface of the first electrode that is in electrical contact with the other of the adjacent photoactive regions.

16. The method according to claim 14, wherein the step of forming a second conductive layer and electrical connectors comprises:
forming interconnection channels extending to the first surface of a first electrode in electrical contact with the other of the adjacent photoactive regions inside the lateral extent of the insulator material; and
depositing conductive material to form the electrical connectors within the interconnection channels and to form the second conductive layer on the photoactive layer.

17. The method according to claim 16, wherein the gaps extending through the second conductive layer that separate the second conductive layer into second electrodes are located such that each of the second electrodes extends over the interconnection channel within which the respective electrical connector extends.

18. The method according to claim 16, wherein the step of depositing conductive material to form the electrical connectors within the interconnection channels and to form the second conductive layer on the photoactive layer comprises any one of:
depositing a conductive material within interconnection channels and over the photoactive layer, the conductive material within interconnection channels forming the electrical connectors and the conductive material overlying the photoactive layer forming the second conductive layer; and
depositing a first conductive material within interconnection channels to form the electrical connectors and then depositing a second conductive material over the photoactive layer to form the second conductive layer.

19. The method according to claim 14, further comprising, between the steps of depositing a photoactive layer and depositing insulator material, forming, between adjacent photoactive regions, at least one insulator channels extending through the photoactive layer,
the step of depositing insulator material being performed so that the insulator material between adjacent photoactive regions further extends through the respective insulator channels, and
the step of forming a second conductive layer and electrical connectors being performed so that the electrical connectors extend in the insulator channels through the insulator material.

* * * * *